(12) United States Patent
Gatard et al.

(10) Patent No.: US 10,848,104 B2
(45) Date of Patent: Nov. 24, 2020

(54) SYSTEM FOR MONITORING THE PEAK POWER OF A TELECOMMUNICATION SIGNAL AND METHOD FOR CALCULATING THE PEAK VALUE AND FOR SELECTING THE ASSOCIATED SUPPLY VOLTAGE

(71) Applicant: WUPATEC, Limoges (FR)

(72) Inventors: Emmanuel Gatard, Panazol (FR); Pierre Lachaud, Saint Just le Martel (FR)

(73) Assignee: WUPATEC, Limoges (FR)

(*) Notice: Subject to any disclaimer, the term of this patent is extended or adjusted under 35 U.S.C. 154(b) by 89 days.

(21) Appl. No.: 16/314,109

(22) PCT Filed: Jul. 4, 2017

(86) PCT No.: PCT/FR2017/051819
§ 371 (c)(1),
(2) Date: Jan. 9, 2019

(87) PCT Pub. No.: WO2018/007752
PCT Pub. Date: Jan. 11, 2018

(65) Prior Publication Data
US 2019/0245490 A1    Aug. 8, 2019

(30) Foreign Application Priority Data

Jul. 6, 2016 (FR) ..................... 16 56453

(51) Int. Cl.
*H03F 1/02* (2006.01)
*H01Q 1/50* (2006.01)
(Continued)

(52) U.S. Cl.
CPC ............ *H03F 1/0227* (2013.01); *H01Q 1/50* (2013.01); *H03F 1/025* (2013.01); *H03F 1/32* (2013.01);
(Continued)

(58) Field of Classification Search
CPC .. H04B 1/0475; H04W 52/367; H03F 1/0227; H03F 3/24; H03F 1/32;
(Continued)

(56) References Cited

U.S. PATENT DOCUMENTS 7,482,869 B2   1/2009   Wilson
8,169,261 B2   5/2012   Wilson
(Continued)

FOREIGN PATENT DOCUMENTS

EP   1597821   11/2005
EP   2926452   10/2015
(Continued)

OTHER PUBLICATIONS

Garcia, O.; Vasic, M.; Alou, P.; Oliver, J.A.; Cobos, J.A., "An overview of fast DC-DC converters for envelope amplifier in RF transmitters," Applied Power Electronics Conference and Exposition (APEC), 2012 Twenty-Seventh Annual IEEE, vol., No., pp. 1313,1318, Feb. 5-9, 2012.
(Continued)

*Primary Examiner* — Thanh C Le
(74) *Attorney, Agent, or Firm* — Nixon & Vanderhye

(57) ABSTRACT

A system for monitoring the peak power of a telecommunication signal to be transmitted for an RF power amplification, includes a digital processing device with a processing chain having an envelope tracking control logic for generating an envelope tracking control signal at discrete levels. The processing chain further includes a driver logic of the DC-DC converter, which processing chain has a device for calculating peak value over a sliding time window and a supply voltage selection device.

20 Claims, 3 Drawing Sheets

(51) Int. Cl.
*H03F 3/189* (2006.01)
*H03F 3/24* (2006.01)
*H03F 1/32* (2006.01)
*H04L 27/26* (2006.01)

(52) U.S. Cl.
CPC ............ *H03F 3/189* (2013.01); *H03F 3/24* (2013.01); *H03F 3/245* (2013.01); *H03F 2200/102* (2013.01); *H03F 2200/451* (2013.01); *H03F 2200/511* (2013.01); *H03F 2201/3215* (2013.01); *H04L 27/2614* (2013.01)

(58) Field of Classification Search
CPC ......... H03F 2200/451; H03F 2200/102; H03F 2201/3215; H01Q 1/50; H04L 27/2614
See application file for complete search history.

(56) References Cited

U.S. PATENT DOCUMENTS

| | | | |
|---|---|---|---|
| 8,749,308 | B2 | 6/2014 | Wilson |
| 9,118,278 | B2 | 8/2015 | Wilson |
| 9,190,958 | B2 | 11/2015 | Wilson |
| 9,641,132 | B2 | 5/2017 | Wilson |
| 2003/0146791 | A1 | 8/2003 | Shvarts et al. |
| 2004/0017251 | A1 | 1/2004 | Mitzlaff |
| 2006/0028271 | A1 | 2/2006 | Wilson |
| 2009/0128236 | A1 | 5/2009 | Wilson |
| 2011/0316623 | A1 | 12/2011 | Bohn et al. |
| 2012/0212291 | A1 | 8/2012 | Wilson |
| 2012/0309333 | A1 | 12/2012 | Nambu |
| 2013/0300513 | A1 | 11/2013 | Wilson |
| 2014/0118072 | A1 | 5/2014 | Briffa et al. |
| 2014/0232470 | A1 | 8/2014 | Wilson |
| 2014/0241462 | A1 | 8/2014 | Bellaouar |
| 2014/0285269 | A1 | 9/2014 | Wilson |
| 2015/0194933 | A1 | 7/2015 | Wilson |
| 2015/0270806 | A1 | 9/2015 | Wagh et al. |
| 2017/0111191 | A1* | 4/2017 | Midya .................... H04L 25/08 |
| 2017/0264244 | A1 | 9/2017 | Zhong et al. |
| 2017/0373644 | A1* | 12/2017 | Gatard ................. H04B 1/0475 |
| 2018/0288697 | A1* | 10/2018 | Camuffo ............... H04W 52/02 |
| 2019/0007011 | A1* | 1/2019 | Berkhout ............. H03F 3/2175 |

FOREIGN PATENT DOCUMENTS

| | | |
|---|---|---|
| JP | 2010-258896 | 11/2010 |
| KR | 101249016 | 4/2013 |
| WO | WO 2004/10283 | 1/2004 |
| WO | WO 2012/066839 | 5/2012 |
| WO | 2016/015256 A1 | 2/2016 |

OTHER PUBLICATIONS

Hiura, S.; Sumi, H.; Takahashi, H., "High-efficiency 400 W power amplifier with dynamic drain voltage control for 6 MHz OFDM signal," Microwave Symposium Digest (MTT), 2010 IEEE MTT-S International , May 23-28, 2010.

Bräckle, A.; Rathgeber, L.; Siegert, F.; Heck, S.; Berroth, M., "Power supply modulation for RF applications," Power Electronics and Motion Control Conference (EPE/PEMC), 2012 15th International, Sep. 4-6, 2012.

A. Bräckle, L. Rathgeber, F. Siegert, S. Heck, M. Berroth, "Envelope tracking of a radio frequency amplifier for Long Term Evolution using a three-level class-G modulator", Advances in Radio Science, 11, pp. 207-212, 2013.

Florian, C.; Cappello, T.; Paganelli, R.P.; Niessen, D.; Filicori, F., "Envelope Tracking of an RF High Power Amplifier With an 8-Level Digitally Controlled GaN-on-Si Supply Modulator," in Microwave Theory and Techniques, IEEE Transactions on, vol. 63, No. 8, pp. 2589-2602, Aug. 2015.

French Search Report, FR 1656453, dated May 12, 2017.
Written-Opinion, FR 1656453. dated Jul. 6, 2016.
International Search Report, PCT/FR2017/051819, dated Oct. 30, 2017.

\* cited by examiner

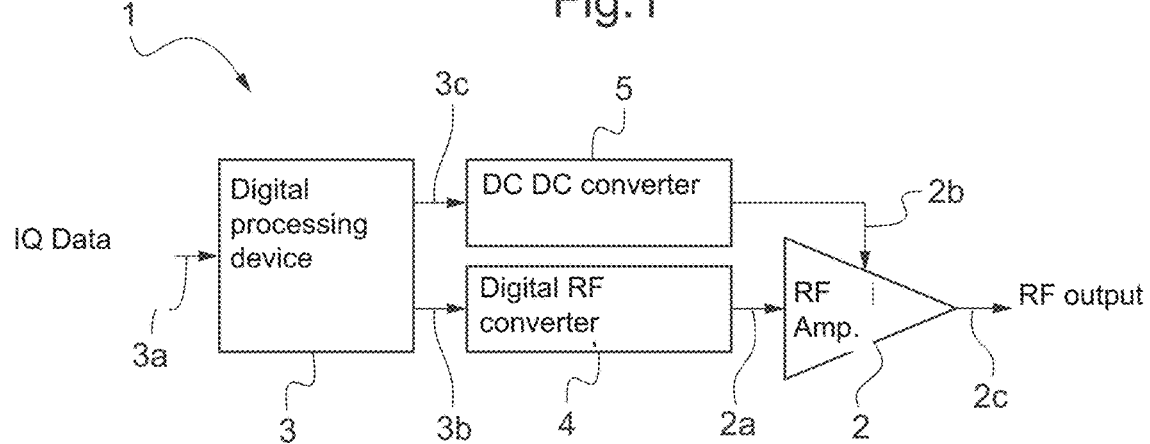
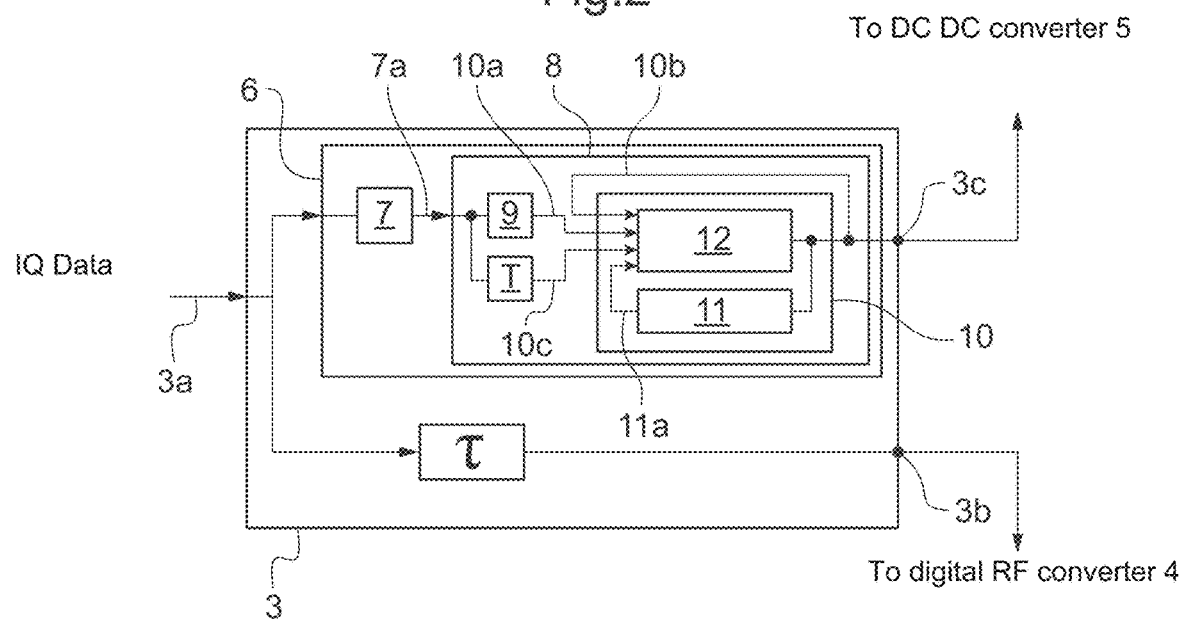

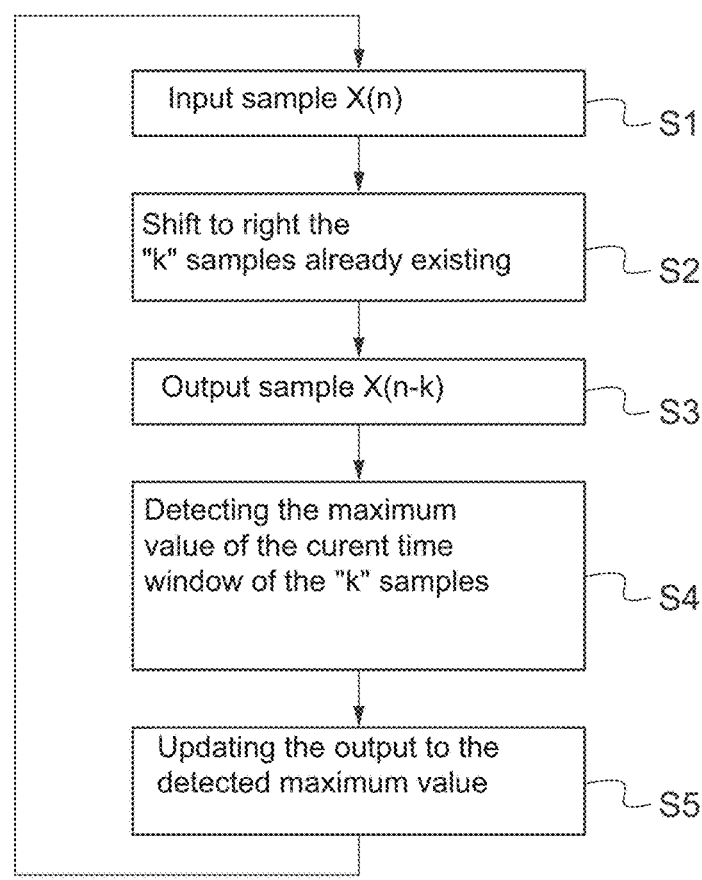
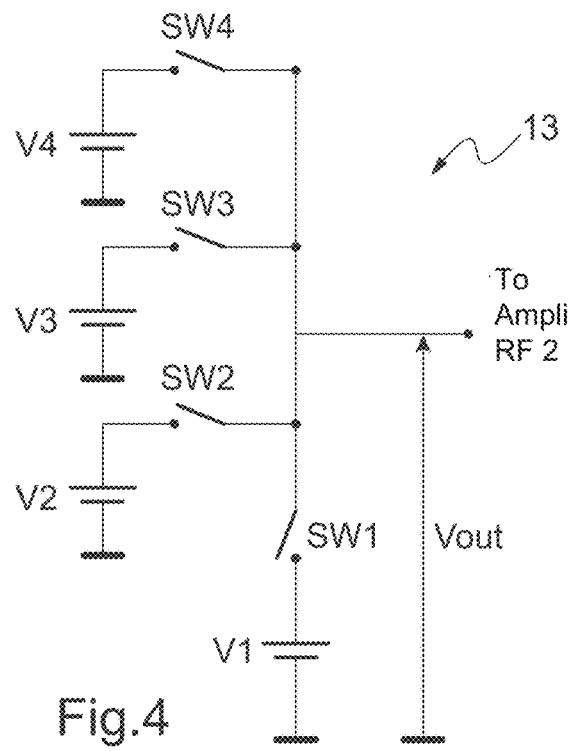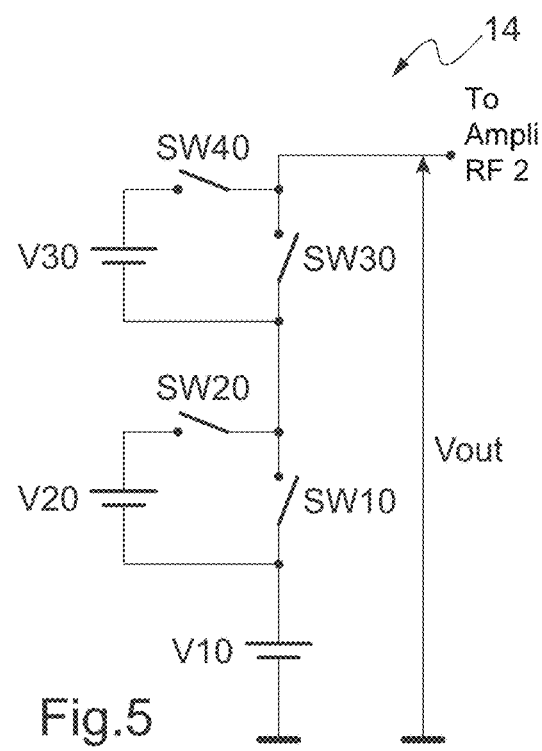

SYSTEM FOR MONITORING THE PEAK POWER OF A TELECOMMUNICATION SIGNAL AND METHOD FOR CALCULATING THE PEAK VALUE AND FOR SELECTING THE ASSOCIATED SUPPLY VOLTAGE

BACKGROUND OF THE INVENTION

Field of the Invention

The present invention relates to the field of radiofrequency (RF) power amplification, and in particular relates to a system for tracking the peak power of a telecommunication signal to be transmitted for an RF power amplification using a sliding time window and to a method for calculating the peak value and selecting the associated supply voltage.

Description of the Related Art

Power amplifiers in radiofrequency (RF) transmitters, for wireless communications, use complex modulations with a high spectral efficiency. These modulations have significant crest factors, i.e., the ratio between the peak power and the average power of the signal ("Peak to Average Power Ratio" (PAPR)). Conventional RF or microwave frequency power amplifiers, which are supplied with a direct supply voltage, provide a maximum efficiency only when they work in compression, i.e., at the peak power of the signal to be transmitted. Most of the time, the RF power amplifier supplies a power much lower than its maximum power, and therefore the efficiency of the RF power amplifier is, under these conditions, lower than its maximum efficiency.

The envelope tracking technique is a supply technique to improve the efficiency of RF power amplifiers. It replaces the direct supply of the RF power amplifier with a dynamic supply that tracks the amplitude of the RF signal to be transmitted. The envelope tracking technique allows a dynamic adjustment of the supply voltage of the RF power amplifier so that the latter always works in compression and therefore at its maximum efficiency, irrespective of the power level of the envelope of the signal to be transmitted.

The constant increase in wireless communication throughputs requires using modulations with a high spectral efficiency and high PAPR such as orthogonal frequency division multiplexing (OFDM). The envelope tracking technique makes it possible, for modern modulation formats, to significantly improve the efficiency of RF power amplifiers while meeting requirements in terms of linearity.

In the case of an RF power amplifier using the envelope tracking technique, the supply voltage is, by definition, constantly readjusted in order to make sure that the RF power amplifier always works in compression and therefore at its maximum efficiency irrespective of the desired transmission power level.

One particular envelope tracking technique is based on the generation of a drain polarization signal of the RF power amplifier of the multilevel (or discrete) type, the operation then being comparable to that of a class G audio amplifier. Class G amplification is easy to carry out, but does not make it possible to improve the efficiency of the RF power amplifier as much as with the continuous envelope tracking technique.

The generation of a polarization command signal with several discrete levels is provided by selecting a supply voltage from among a plurality of supplies. This particular envelope tracking technique has the advantage of supporting large bandwidths while maintaining a high efficiency without using an additional linear amplifier, in class A or AB, within the DC-DC converter.

For an envelope tracking signal using discrete supply levels, each applied drain voltage is defined for a given input power range of the RF power amplifier, the span of each range depending primarily on the number of discrete levels. This type of technique is necessarily coupled with a technique for pre-distortion of the RF signal in order to preserve the overall linearity of the RF transmitter.

The power amplification of RF and microwave frequency signals, making it possible to achieve both good efficiency and good linearity, proves very complex and systematically requires a compromise between efficiency and linearity. The envelope tracking technique makes it possible to improve the compromise greatly between efficiency and linearity for high-power applications, i.e., starting from 2 Watts.

The issue then lies in the ability to have DC-DC converters capable of providing high powers, having a very good efficiency, being extremely linear, generating little noise and above all supporting wide modulation bands.

Irrespective of the envelope tracking technique used, the efficiency of the DC-DC converters decreases when the bandwidth of the modulated signal increases. It then appears complex to use an envelope tracking technique for high-power applications with modern communication signals having very large bandwidths.

The DC-DC converters for the envelope tracking technique must have bandwidths much greater than the bandwidth of the RF signal to be transmitted. Faced with the growing increase in bandwidths for modern telecommunications signals, it appears relatively complex to have DC-DC converters with a good efficiency, a large bandwidth and a low cost for high-power applications.

Jointly with the direct envelope tracking technique, in order to decrease the constraints weighing on the DC-DC converter, a so-called band reduction technique may be used. It makes it possible to decrease the spectral occupancy of the polarization command signal. However, the reduction in bandwidth of the polarization command signal necessarily causes a drop in efficiency of the RF power amplifier, given that the command signal no longer exactly follows the envelope of the signal to be transmitted. The band reduction techniques are complex to implement and do not always make it possible to consider very wide modulation bands with a good overall efficiency of the system.

The particular multilevel envelope tracking technique makes it possible to achieve wider modulation bandwidths than the continuous envelope tracking technique. Due to the small number of discrete levels, generally comprised between 4 and 8, 16 at most, the multilevel envelope tracking technique does not make it possible to obtain RF power amplifier efficiencies as good as with a continuous command signal. However, the overall losses in the DC-DC converter are significantly lower.

This particular method of the envelope tracking technique, the linearization of which is more complex to implement, potentially makes it possible to achieve very significant modulation bandwidths. However, once the modulation bandwidth increases, the voltage levels of the command signal may have excessively short durations with respect to the capacities of the DC-DC converter. This then risks to lead to a significant drop in the efficiency of the DC-DC converter, transmission errors or the deterioration of the RF power amplifier if it is working at too great a compression.

The DC-DC converters must, for each of the solutions, always have very high switching speeds in order to best comply with the characteristics of the envelope of the modulated signal. The multilevel envelope tracking technique makes it possible to significantly improve the efficiency-bandwidth compromise, without solving it for large modulation bandwidths, due to the fact that the recurrences of switchings of the DC-DC converter remain high in number and sometimes the durations of the voltage levels too short.

The mismatch between the switching speed capacities of the DC-DC converter and the characteristics of the command signal to be generated do not make it possible to apply the multilevel envelope tracking technique to achieve very wide modulation bands without malfunction of the system or transmission errors.

BRIEF SUMMARY OF THE INVENTION

The present invention aims to resolve the drawbacks of the prior art, by proposing a system for tracking the peak power of a telecommunication signal to be transmitted for an RF power amplification of said telecommunication signal to be transmitted comprising a driver logic of the DC-DC converter making it possible to greatly push back the efficiency-bandwidth limitation imposed by the DC-DC converters in order to make the envelope tracking technique applicable to high-power applications with high throughputs, said system making it possible to generate a high-power command signal suitable for applications with a very wide modulation band without necessarily requiring ultra-fast converters, and therefore switching transistors, capable of switching strong currents in a very short time, said system also making it possible to keep a very good efficiency on the DC-DC converters even for wide modulation bands.

The driver logic consists, inter alia, of analyzing and detecting the maximum value of the envelope tracking command signal over a sliding time window, then applying, in place of a traditional envelope tracking command signal, a supply voltage level on the RF power amplifier from among a certain number of available voltage levels, said voltage level being applied during a minimum duration equal to the duration of the sliding time window. The invention thus makes it possible to generate a supply signal of the discrete type that is slowly variable with respect to the modulation band of the signal, these characteristics making it possible to use a very inexpensive DC-DC converter with a high efficiency even for wide modulation bands.

The invention also proposes a method for calculating the peak value and selecting the supply voltage implemented by a system as described above, and an RF antenna equipped with such a system or implementing such a method.

The present invention therefore relates to a system for tracking the peak power of a telecommunication signal to be transmitted for amplification of the RF power of said telecommunication signal to be transmitted, comprising an RF power amplifier having an RF input, a supply voltage input and an RF output, a digital processing device, a digital to RF converter, and a DC-DC converter, the digital processing device having an input capable of receiving the telecommunication signal to be transmitted in the form of digital data, a first output connected to an input of the digital to RF converter and a second output connected to an input of the DC-DC converter, the digital to RF converter having an output connected to the RF input of the RF power amplifier, the DC-DC converter having an output connected to the supply voltage input of the RF power amplifier, the output of the DC-DC converter being able to assume a discrete voltage value from among N discrete voltage values, N being an integer greater than or equal to 2, the digital processing device comprising, between its input and its first output, a delay element T, and between its input and its second output, a processing chain comprising an envelope tracking command logic capable of creating an envelope tracking command signal with N discrete levels from digital data received at the input of the digital processing device, said envelope tracking command signal with N discrete levels being sampled at a predetermined sampling frequency, characterized in that the processing chain further comprises, downstream from the envelope tracking command logic, a driver logic of the DC-DC converter comprising a device for calculating the peak value and a device for selecting the supply voltage, the device for calculating the peak value being capable of:

windowing the envelope tracking command signal with N discrete levels, using a sliding time window, the duration of which is defined by a predefined number of samples of the envelope tracking command signal with N discrete levels, the offset between time windows being equal to a sample of the envelope tracking command signal with N discrete levels, and calculating the maximum value of the envelope tracking command signal with N discrete levels over each time window of the sliding time window, and the supply voltage selection device being capable of commanding the DC-DC converter in order to impose, on the output of the latter, from among the N discrete voltage values, as a function of the maximum value of the envelope tracking command signal with N discrete levels over the current time window, of the value of the envelope tracking command signal with N discrete levels delayed by the duration of the sliding time window and of the current value of the output of the device for selecting the supply voltage, a discrete supply voltage value greater than or equal to the envelope tracking command signal with N discrete levels, said discrete supply voltage value being applied during a minimum duration equal to the duration of the sliding time window.

According to one specific feature of the invention, the delay element T is chosen such that the RF signal corresponding to digital data of the telecommunication signal to be transmitted at the RF input of the RF power amplifier is synchronized with the supply voltage of the RF signal envelope tracking type for said same digital data at the supply voltage input of the RF power amplifier.

The digital data of the telecommunication signal to be transmitted are preferably baseband modulation data (I and Q).

The command logic of the processing chain is configured to implement an envelope tracking command law with discrete levels, the created envelope tracking command signal with discrete levels being sampled at a predetermined sampling frequency.

The predetermined sampling frequency is preferably between 10 MHz and 500 MHz, one skilled in the art knowing how to adapt the predetermined sampling frequency as a function of the throughput of the signal to be transmitted.

The proposed invention consists in generating an optimal discrete-type command signal at each moment for which the duration at each discrete voltage level respects a minimum duration without having a greater duration than necessary in order to obtain the best overall efficiency of the system. The generated command signal makes it possible to be compatible with the specificities of an envelope tracking signal so as not to over-compress the RF power amplifier and lead to a malfunction of the system.

The invention does not make it possible to obtain as good an RF power amplifier efficiency as with a continuously variable envelope tracking command signal, but makes it possible to stay close enough to the maximum efficiency that can be achieved by the RF power amplifier. However, the proposed invention makes it possible to greatly minimize the losses within the DC-DC converter, even for applications with a very wide modulation band, which makes it possible to obtain a significantly improved overall efficiency.

The command signal of the RF power amplifier can only assume one voltage value at a time from among the N possible levels, and these voltage levels do not adapt to the rapid variations of the envelope signal, the selected voltage level being applied during a minimum duration equal to the sliding time window. The choices of the number N of levels and of the duration of the sliding time window depend primarily on the capacities of the DC-DC converter, the throughput of symbols to be transmitted and the modulation format (for example, QAM (quadrature amplitude modulation) or OFDM).

Thus, the proposed invention makes it possible to greatly push back the efficiency-bandwidth limitation that is imposed by the DC-DC converters in order to make the envelope tracking technique applicable to high-power applications with high throughputs, said system making it possible to generate a high-power command signal suitable for applications with a very wide modulation band without necessarily having to have ultrafast converters, and therefore switching transistors, capable of switching strong currents in a very short time, said system also making it possible to keep a very good efficiency on the DC-DC converters even for wide modulation bands.

For each digital sample of the envelope tracking command signal with N discrete levels, the device for calculating the peak value makes it possible to determine the maximum value of said signal over a sliding time window duration following each sample. This information, jointly with the knowledge of the voltage level currently applied to the RF power amplifier and of the value of the envelope tracking command signal with discrete levels delayed by the duration of the sliding time window, makes it possible to determine whether a change in voltage level is necessary.

The discrete voltage supplied to the RF power amplifier is always greater than the command voltage that would be derived from a continuous envelope tracking command signal in order to see to the proper operation of the RF power amplifier, i.e., in order to avoid any excessive compression of the RF power amplifier.

In the case of the signal derived from the system proposed by the invention, each voltage level has a minimum duration. Beyond this minimum duration, the duration of a command voltage level is only a multiple of the sampling period of the digital signal.

This type of driver makes it possible to greatly decrease the stresses on the DC-DC converter in terms of switching speed and thus to obtain a very good efficiency of the DC-DC converter. Furthermore, the efficiency of the RF power amplifier will never be optimal even if the number of discrete levels is sufficient. The loss of efficiency of the RF power amplifier in reality proves low with respect to the efficiency gain obtained on the DC-DC converter and the gain obtained on the bandwidth of the system.

In the case of a command signal using the technique according to the invention, the use at a given moment of a command voltage depends on the input power of the RF power amplifier, the command voltage currently applied to the RF power amplifier, but also of the peak voltage of the envelope of the modulated signal to be coming over a duration determined by the analysis sliding time window of the peak value.

The generated voltage levels may be distributed uniformly or non uniformly depending on the electrical characteristics of the RF power amplifier to be supplied.

Furthermore, the driver logic is easy to implement in a digital circuit, thus making the number of logic circuits necessary in the digital circuits as well as their operating frequency minimal, which is reflected by a lower electricity consumption and a lower supply cost of the circuits. The invention also makes it possible to use a slower DC-DC converter, which is therefore less expensive to manufacture.

Furthermore, this driver logic makes it possible to eliminate thresholding effects that may lead in some cases to very short pulses and therefore transmission errors.

The delay $\tau$ makes it possible to synchronize the correct supply voltage of the RF power amplifier based on the input data.

According to one specific feature of the invention, the device for selecting the supply voltage comprises a time counter configured to be reset and triggered upon each change of output state of the device for selecting the supply voltage, said device for selecting the supply voltage being configured not to change the state of its output as long as the time counter has not reached the duration of the sliding time window.

Thus, each time the discrete command voltage derived from the output of the DC-DC converter changes state, the time counter is reset and triggered in order to determine whether the duration of the output level is, at each moment, greater or less than the minimum duration to be respected, namely the duration of the sliding time window.

The device for selecting the supply voltage may, if necessary, change the state of the output of the DC-DC converter only when the time counter has reached the duration of the sliding time window.

According to one particular feature of the invention, the device for selecting the supply voltage further comprises an output state change decision module configured to modify the output state of the device for selecting the supply voltage, to the maximum value of the envelope tracking command signal with N discrete levels over the current time window, when the time counter has reached the duration of the sliding time window, and the maximum value of the envelope tracking command signal with N discrete levels over the current time window is less than the current value of the output of the device for selecting the supply voltage or the current value of the output of the device for selecting the supply voltage is less than the value of the envelope tracking command signal with N discrete levels delayed by the duration of the sliding time window.

Thus, in order to determine whether a change in voltage level is necessary at the RF power amplifier, a test of the Boolean type is done in the output state change decision module as from the knowledge of the information derived from the different conditions previously described.

According to one particular feature of the invention, the envelope tracking command logic comprises a device for calculating the module of the telecommunication signal to be transmitted and a device for creating the envelope tracking command signal configured to create the envelope tracking command signal with N discrete levels by comparing the value of the module calculated by said calculating device with (N−1) predefined switching thresholds.

Thus, the envelope tracking command signal with N discrete levels is generated from the module of the envelope signal and the knowledge of the switching thresholds from one supply to the other. For a signal with N discrete levels, there are (N−1) switching thresholds.

According to one specific feature of the invention, the number of voltage levels N is between 2 and 16.

The choice of N depends primarily on the capacities of the DC-DC converter, the throughput of symbols to be transmitted and the modulation format.

It should be noted that the larger N is, the more complicated and expensive the system is to manufacture.

N will preferably be between 4 and 8.

According to one specific feature of the invention, the predefined number of samples of the envelope tracking command signal with N discrete levels defining the duration of the sliding time window is between 2 and 128, depending on the operating frequency of the digital circuit and the throughput to be sent.

According to one specific feature of the invention, the digital processing device is implemented in a programmable digital circuit, preferably a processor, a microprocessor, a microcontroller, a digital signal processing (DSP) device, an application-specific integrated circuit (ASIC) or a field-programmable gate array (FPGA).

Thus, the digital processing device may easily be embedded in a traditional programmable digital circuit.

The digital processing device operates on the one hand at a weaker frequency than for continuous envelope tracking techniques, since it no longer needs a PWM (pulse width modulation) or sigma-delta command signal, and also requires the use of fewer digital resources to generate the command signal.

The implementation of a command law of the polynomial function or table type is not necessary, simple comparison thresholds being sufficient to generate such a command signal with discrete levels.

According to one particular feature of the invention, the DC-DC converter is of the parallel multi supply input type or cascading multi supply input type.

Such types of DC-DC converter are for example described in the following documents:

Garcia, O.; Vasic, M.; Alou, P.; Oliver, J A; Cobos, J A, "An overview of fast DC-DC converters for envelope amplifier in RF transmitters", Applied Power Electronics Conference and Exposition (APEC), 2012 Twenty-Seventh Annual IEEE, pp. 1313-1318, Feb. 5-9, 2012; and Florian C.; Cappello, T.; Paganelli, R. P.; Niessen, D.; Filicori, F., "Envelope Tracking of an RF High Power Amplifier With an 8-Level Digitally Controlled GaN-on-Si Supply Modulator" in *Microwave Theory and Techniques, IEEE Transactions*, vol. 63, no. 8, pp. 2589-2602, August 2015.

Thus, these two particular types of DC-DC converter are particularly appropriate for generating multilevel signals and also make it possible to obtain good efficiencies.

It should be noted that the DC-DC converter could also be another type of DC-DC converter appropriate for generating a controlled-variation discrete command signal, without departing from the scope of the present invention.

The parallel multi supply input DC-DC converter is based on a parallel configuration of the supplies. Different supply voltages are connected to the multiple supply inputs of the DC-DC converter, and one of the supply voltages is selected, by power transistor switches, at the output of the DC-DC converter, the DC-DC converter having as many supply inputs as there are power levels to be applied.

The DC-DC converter of the cascading multi supply input type is based on a serial configuration of the supplies. This type of converter makes it possible to obtain N voltage levels from (In(N)/In(2))+1 supply inputs, where In is the Napierian logarithm function. In this architecture, the N generated voltage levels are interdependent and the output voltages cannot therefore be chosen independently.

According to one particular feature of the invention, the digital to RF converter comprises a digital to analog converter associated with an RF mixer of the IQ modulator type for example.

Thus, the digital to RF converter may first convert the digital data coming from the digital processing device into the analog data, via the digital to analog converter, then mix the analog data with an RF signal, via the RF mixer.

According to one particular feature of the invention, the system further comprises a low-pass filter arranged between the output of the DC-DC converter and the supply voltage input of the RF power amplifier.

Thus, the low-pass filter allows perfect control of the transitional characteristics of the discrete-type command signal from one discrete voltage level to another and also the spectral spread of the discrete-type command signal.

According to one particular feature of the invention, the digital processing device further comprises a predistortion logic that linearizes the gain of the RF power amplifier.

Thus, the predistortion logic makes it possible to keep a good linearity of the RF power amplifier.

The present invention also relates to a method for calculating the peak value and selecting the supply voltage implemented by a system for tracking the peak power of a telecommunication signal to be transmitted for an RF power amplification as described above, characterized in that it comprises the following steps: time windowing, using a sliding time window, of an envelope tracking command signal with N discrete levels; calculating the maximum value of the envelope tracking command signal with N discrete levels over each time window of the sliding time window; selecting, from among N discrete voltage values, based on the maximum value of the envelope tracking command signal with N discrete levels over the current time window and the value of the envelope tracking command signal with N discrete levels delayed of the duration of the sliding time window, a discrete supply voltage value greater than or equal to the envelope tracking command signal with N discrete levels, said discrete supply voltage value being applied during a minimum duration equal to the duration of the sliding time window; and commanding a DC-DC converter in order to impose, on the output of the latter, the selected discrete supply voltage value.

Thus, said method makes it possible to limit the switching speed constraints on the DC-DC converter of the RF power amplification system with envelope tracking.

It should be noted that said calculated maximum value corresponds to the value of the sample having the maximum value from among all of the samples of the current sliding time window.

The present invention also relates to an RF transmission antenna equipped with a system for tracking the peak power of a telecommunications signal to be transmitted for an RF power amplification of said telecommunication signal to be transmitted as described above or implementing a method for calculating the peak value and selecting the supply voltage as described above.

To better illustrate the subject matter of the present invention, below we will describe, as an illustration and non-limitingly, preferred embodiments, in reference to the appended drawings.

BRIEF DESCRIPTION OF THE DRAWINGS

In these drawings:

FIG. 1 is a block diagram of a system for tracking the peak power for an RF power amplification according to the present invention;

FIG. 2 is a block diagram of a digital processing device of the system for tracking the peak power for an RF power amplification according to the present invention;

FIG. 3 is a flowchart illustrating a method for calculating the peak power over a sliding time window according to the present invention;

FIG. 4 is a schematic diagram of a DC-DC converter of the system for tracking the peak power for an RF power amplification according to a first embodiment of the present invention;

FIG. 5 is a schematic diagram of a DC-DC converter of a system for tracking the peak power for an RF power amplification according to a second embodiment of the present invention;

DETAILED DESCRIPTION OF THE PREFERRED EMBODIMENTS

Figure 6:
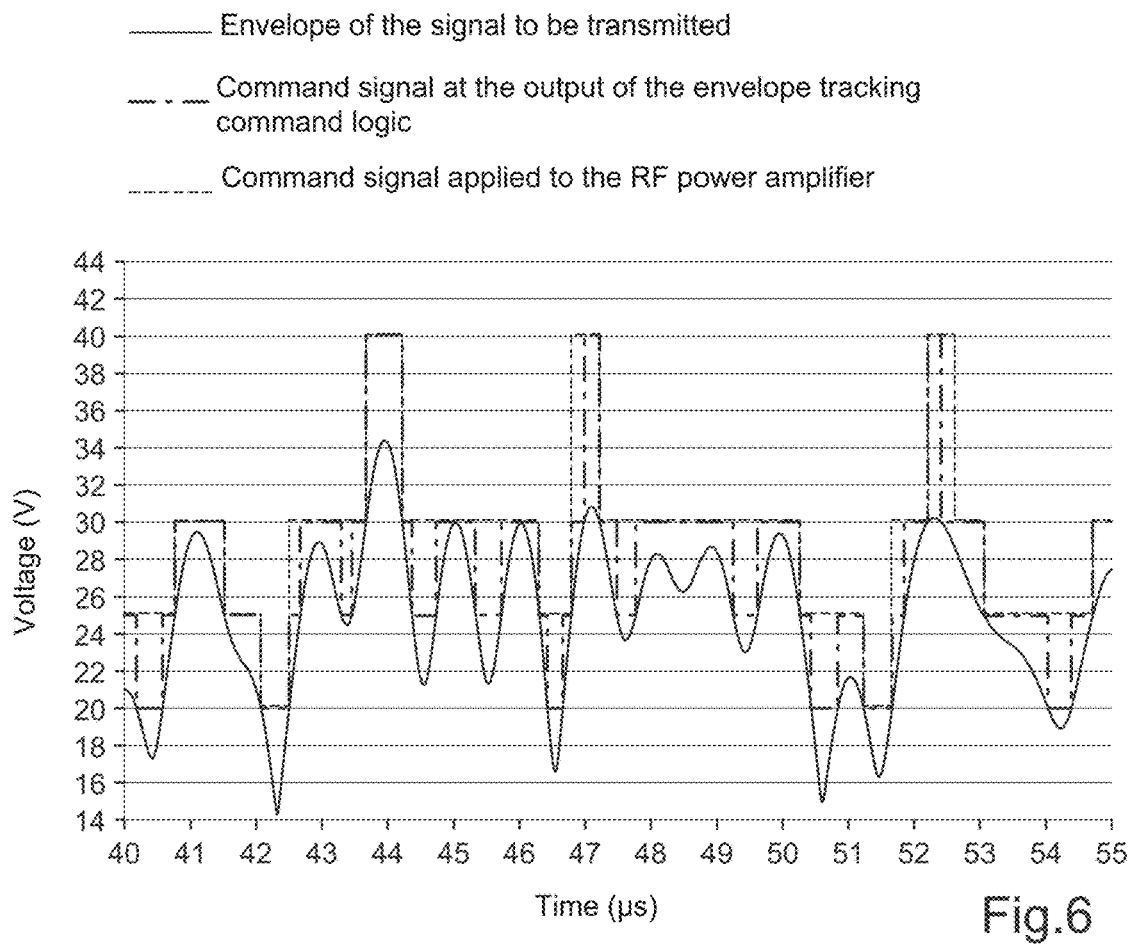
FIG. 6 illustrates exemplary curves of different envelope tracking command signals in the system for tracking the peak power for an RF power amplification according to the present invention.

FIG. 1 shows a system 1 for tracking the peak power for an RF power amplification according to the present invention.

The system 1 for tracking the peak power for an RF power amplification comprises an RF power amplifier 2 having an RF input 2a, a supply voltage input 2b and an RF output 2c, a digital processing device 3, a digital to RF converter 4 and a DC-DC converter 5.

The digital processing device 3 has an input 3a able to receive I/O digital data representing a telecommunications signal to be transmitted by RF by the RF power amplifier 2, a first output 3b connected to an input of the digital to RF converter 4 and a second output 3c connected to an input of the DC-DC converter 5.

The digital to RF converter 4 has an output connected to the RF input 2a of the RF power amplifier.

The DC-DC converter 5 has an output connected to the supply voltage input 2b of the RF power amplifier 2, the output of the DC-DC converter 5 being able to assume a discrete voltage value from among N discrete voltage values, N being an integer greater than or equal to 2, preferably between 2 and 8.

The RF power amplifier 2 comprises semiconductor power elements such as semiconductor power transistors (not shown in FIG. 1).

The digital to RF converter 4 comprises a digital to analog converter associated with an RF mixer (not shown in FIG. 1), the digital to analog converter converting the digital data coming from the digital processing device 3 into analog data, and the RF mixer mixing said analog data with an RF signal.

The digital processing device 3 and the DC-DC converter 5 will be described in more detail hereinafter.

This system 1 thus makes it possible to apply an envelope tracking technique with discrete levels in order to improve the efficiency of the RF power amplifier 2, the supply of the RF power amplifier 2 being dynamic and following the amplitude of the RF signal to be transmitted, the RF power amplifier 2 thus always operating in compression and therefore at its maximum efficiency irrespective of the power level of the envelope of the RF signal.

The command signal of the RF power amplifier 2, at its supply voltage input 2b, can dynamically assume one of the N possible discrete voltage values in order to track the envelope of the RF signal to be transmitted.

The discrete voltage values can be distributed uniformly or non uniformly according to the electrical characteristics of the RF power amplifier 2 to be supplied.

FIG. 2 shows the digital processing device 3 of the system for tracking the peak power for an RF power amplification 1 according to the present invention.

The digital processing device 3 comprises, between its input 3a and its first output 3b, a delay element T, and, between its input 3a and its second output 3c, a processing chain 6.

The processing chain 6 comprises an envelope tracking command logic 7 capable of creating an envelope tracking command signal with N discrete levels 7a from digital data received at the input 3a of the digital processing device 3, said envelope tracking command signal with N discrete levels 7a being sampled at a predetermined sampling frequency.

The predetermined sampling frequency is preferably between 10 MHz and 500 MHz.

The envelope tracking command logic 7 comprises a calculating device for calculating the modulus of the telecommunication signal to be transmitted (not shown in FIG. 2) and a device for creating an envelope tracking command signal (not shown in FIG. 2) configured to create the envelope tracking command signal with N discrete levels 7a by comparing the value of the modulus calculated by said calculating device with (N−1) predefined switching thresholds from one supply to the other, said envelope tracking command signal with N discrete levels 7a being greater than or equal to an envelope tracking command signal that would be of the continuous type.

For example, in the case where N=4, if M(n) is the modulus of the envelope of the modulated signal for the sample n and S1, S2 and S3 are the three switching thresholds of the four supply levels V1, V2, V3 and V4, the envelope tracking command signal with 4 discrete levels can assume one of the four following available discrete levels:

V1 if M(n)≤S1;
V2 if S1<M(n)≤S2;
V3 if S2<M(n)≤S3; and
V4 if S3<M(n).

The processing chain 6 further comprises, downstream from the envelope tracking command logic 7, a driver logic 8 of the DC-DC converter 5 comprising a device for calculating the peak value 9 and a device for selecting the supply voltage 10.

The device for calculating the peak value 9 is able to window, using a sliding time window whose duration is defined by a predefined number of samples of the envelope tracking command signal with N discrete levels 7a, the offset between time windows being equal to a sample of the envelope tracking command signal with N discrete levels 7a, the envelope tracking command signal with N discrete levels 7a coming from the envelope tracking command logic 7 and calculate the maximum value 10a of the envelope tracking command signal with N discrete levels 7a over each time window of the sliding time window.

The predefined number of samples of the envelope tracking command signal with N discrete levels 7a defining the duration of the sliding time window is preferably between 2 and 128.

The method for calculating the peak value implemented by the device for calculating the peak value 9 will be described in more detail with FIG. 3.

The device for selecting the supply voltage 10 is capable of commanding the DC-DC converter 5 in order to impose, at the output of the latter, from among the N discrete voltage values, depending inter alia on the maximum value 10a of the envelope tracking command signal with N discrete levels 7a over the current time window, a discrete supply voltage value greater than or equal to the envelope tracking command signal with N discrete levels 7a so as not to overcompress the RF power amplifier 2, said discrete supply voltage value being applied during a minimum duration equal to the duration of the sliding time window.

The delay element τ is chosen such that the RF signal corresponding to digital data of the telecommunication signal to be transmitted at the RF input 2a of the RF power amplifier 2 is synchronized with the supply voltage of the envelope tracking type of the RF signal for said same digital data at the supply voltage input 2b of the RF power amplifier 2.

The device for selecting the supply voltage 10 comprises a time counter 11 and an output state change decision module 12.

The time counter 11 is configured to be reset and triggered upon each output state change of the device for selecting the supply voltage 10, so as to determine whether the duration of the output level is, at each moment, greater or less than the duration of the sliding time window, a duration excess signal 11a being sent by the time counter 11 to the output state change decision module 12 when the duration of the output level is greater than the duration of the sliding time window.

The output state change decision module 12 is configured to modify the state of the output of the supply voltage selection device 10, to the maximum value 10a of the envelope tracking command signal with N discrete levels 7a over the current time window, when the following Boolean test is true: (the time counter 11 has reached the duration of the sliding time window) AND ((the maximum value 10a of the envelope tracking command signal with N discrete levels 7a over the current time window is less than the current value 10b of the output of the supply voltage selection device 10) OR (the current value 10b of the output of the supply voltage selection device 10 is less than the value 10c of the envelope tracking command signal with N discrete levels 7a delayed by the duration T of the sliding time window)).

The discrete voltage supplied to the RF power amplifier 1 is always greater than the command voltage that would be derived from a continuous envelope tracking command signal in order to see to the proper operation of the RF power amplifier 2, i.e., in order to avoid any excessive compression of the RF power amplifier 2.

In the case of the signal derived from the system proposed by the invention, each voltage level has a duration equal to the duration of the sliding time window. Beyond this minimal duration, the duration of a command voltage level is only a multiple of the sampling period of the envelope tracking command signal with N discrete levels 7a.

It should be noted that the digital processing device 3 could also comprise a predistortion logic that linearizes the gain of the RF power amplifier 2, without departing from the scope of the present invention.

It should be noted that the entire digital processing device 3 is implemented in a programmable digital circuit, preferably a processor, a microprocessor, a microcontroller, a digital signal processing (DSP) device, an application-specific integrated circuit (ASIC), or a field-programmable gate array (FPGA).

FIG. 3 shows a flowchart illustrating a method for calculating the peak value implemented by the device for calculating the peak value 9 according to the present invention.

The device for calculating the peak value 9 is configured to carry out a function for calculating the peak value of the envelope tracking command signal with N discrete levels 7a over a sliding time window with duration T, this duration T being done by taking "k" digital samples of said envelope tracking command signal with N discrete levels 7a.

This calculating function is even easier to do in practice as the number N of discrete levels is small. The number N of discrete levels generally being between 4 and 8, the associated digital cost is therefore relatively limited.

The method for calculating the peak value implemented by the device for calculating the peak value 9 comprises the following steps:

S1: the entry, into the device for calculating the peak value 9, of a sample X(n) of the envelope tracking command signal with N discrete levels 7a, n being the number of said incoming sample;

S2: the shift toward the right of the k samples of the envelope tracking command signal with N discrete levels 7a already existing in the device for calculating the peak value 9;

S3: the output of the sample X(n–k) of the envelope tracking command signal with N discrete levels 7a already existing in the device for calculating the peak value 9;

S4: detecting the maximum value from among the k samples of the current time window currently existing in the device for calculating the peak value 9; and S5: updating the output of the device for calculating the peak value 9 to the detected maximum value.

For each digital sample of the envelope tracking command signal with N discrete levels 7a, the sliding time window makes it possible to determine the maximum value of the signal over a duration T following each sample.

It should be noted that said calculated maximum value corresponds to the value of the sample having the maximum value from among all of the samples of the current sliding time window.

The invention also relates to a method for calculating the peak value and selecting the supply voltage implemented by the system 1 for tracking the peak power of a telecommunication signal to be transmitted for an RF power amplification, characterized in that it comprises the following steps:

the time windowing, using a sliding time window, of an envelope tracking command signal with N discrete levels 7a;

calculating the maximum value 10a of the envelope tracking command signal with N discrete levels 7a over each time window of the sliding time window;

selecting, from among N discrete voltage values, based on the maximum value 10a of the envelope tracking command signal with N discrete levels 7a over the current time window and the value 10c of the envelope tracking command signal with N discrete levels 7a delayed by the duration T of the sliding time window, a discrete supply voltage value greater than or equal to the envelope tracking command signal with N discrete levels 7a, said discrete supply voltage value being applied during a minimum duration equal to the duration T of the sliding time window; and commanding a DC-DC converter 5 in order to impose, on the output of the latter, the selected discrete supply voltage value.

FIG. 4 shows a parallel multi supply input DC-DC converter 13 of the system for tracking the peak power for an RF power amplification 1 according to a first embodiment of the present invention.

According to this first embodiment, the DC-DC converter 5 is a parallel multi supply input DC-DC converter 13.

In this first exemplary embodiment, the parallel multi supply input DC-DC converter 13 includes four different supply voltages with independent values V1, V2, V3 and V4, four being the desired number of possible discrete voltage values at the output of the DC-DC converter 13, and four power transistor switches SW1, SW2, SW3 and SW4 each including first and second terminals, the first terminals of the four switches SW1 to SW4 respectively being connected to the four supply voltages V1 to V4, and the second terminals of the four switches SW1 to SW4 being connected to the output voltage Vout of the DC-DC converter 13.

It should be noted that the DC-DC converter 13 could also include a number N of supply voltages and switches, without departing from the scope of the present invention.

The four supply voltages V1 to V4, as well as the output voltage Vout, are referenced relative to the ground of the circuit.

The output state change decision module 12 also incorporates a switch driver logic.

The four switches SW1 to SW4 are commanded dynamically by the output state change decision module 12 of the digital processing device 3, such that a single switch from among the four switches SW1 to SW4 is closed at a time in order to apply the output voltage associated with the output voltage level Vout.

Thus, the DC-DC converter 13 can generate a command signal of the discrete type with slow variation, the switching speed of which is not the preponderant element, this DC-DC converter 13 having an excellent conversion efficiency.

The parallel multi supply input DC-DC converter 13 thus relies on a parallel configuration of the supply voltages V1 to V4, said DC-DC converter 13 having as many supply voltage inputs as there are output levels to be applied.

It should be noted that the DC-DC converter 13 could further comprise a low-pass filter arranged between the output Vout of the DC-DC converter 13 and the supply voltage input 2b of the RF power amplifier 2, without departing from the scope of the present invention. In this case, the low-pass filter may be a simple LC (inductor-capacitor) resonant circuit or a low-pass filter of an order greater than or equal to 2.

FIG. 5 shows a cascading multi supply input DC-DC converter 14 of the system for tracking the peak power for an RF power amplification 1 according to a second embodiment of the present invention.

According to this second embodiment, the DC-DC converter 5 is a cascading multi supply input DC-DC converter 14.

The cascading multi supply input DC-DC converter 14 is based on a serial configuration of the supply voltages. This type of DC-DC converter makes it possible to obtain N possible discrete levels from (In(N)/In(2))+1 supply voltage inputs, the N generated discrete levels being interdependent and the supply voltages cannot therefore be chosen independently.

The exemplary cascading multi supply input DC-DC converter 14 includes three different supply voltages V10, V20 and V30, and four power transistor switches SW10, SW20, SW30 and SW40, each including first and second terminals.

It should be noted that the DC-DC converter 14 could also include a number (In(N)/In(2))+1 of supply voltages and a number 2*(In(N)/In(2)) of switches, without departing from the scope of the present invention.

The second terminal of the first switch SW10 is connected to the positive terminal of the first supply voltage V10 and to the negative terminal of the second supply voltage V20.

The first terminal of the first switch SW10 is connected to the second terminal of the second switch SW20, to the second terminal of the third switch SW30 and to the negative terminal of the third supply voltage V30.

The first terminal of the second switch SW20 is connected to the positive terminal of the second supply voltage V20.

The first terminal of the fourth switch SW40 is connected to the positive terminal of the fourth supply voltage V30.

The output voltage Vout of the DC-DC converter 14 is connected to the first terminal of the third switch SW30 and to the second terminal of the fourth switch SW40.

The four switches SW10 to SW40 are commanded dynamically by the output state change decision module 12 of the digital processing device 3, such that the output voltage Vout is equal to:

V10 when the switches SW10 and SW30 are closed and the switches SW20 and SW40 are open;

(V10+V20) when the switches SW20 and SW30 are closed and the switches SW10 and SW40 are open;

(V10+V30) when the switches SW10 and SW40 are closed and the switches SW20 and SW30 are open; and (V10+V20+V30) when the switches SW20 and SW40 are closed and the switches SW10 and SW30 are open.

It should be noted that the DC-DC converter 14 could further comprise a low-pass filter arranged between the output Vout of the DC-DC converter 14 and the supply voltage input 2b of the RF power amplifier 2, without departing from the scope of the present invention. In this case, the low-pass filter may be a simple LC (inductor-capacitor) resonant circuit or a low-pass filter of an order greater than or equal to 2.

FIG. 6 shows exemplary curves of different envelope tracking command signals in the system 1 for tracking the peak power for an RF power amplification according to the present invention.

The curve in a continuous line shows the continuous envelope of a signal to be transmitted as an example, said envelope being shown to scale to better understand the switching moments, said curve being shown as supply voltage over time in order to facilitate the reader's understanding.

The curve in a dash and dot line shows the envelope tracking command signal on four discrete levels at the output of the envelope tracking command logic 7, said curve being shown as supply voltage over time.

The curve in dotted lines shows the command signal at the output of the DC-DC converter 5 applied to the RF power amplifier 2, said curve being shown as supply voltage over time.

In this example, the method for calculating the peak value and selecting the supply voltage is applied on the signal derived from the envelope tracking command logic 7 for a modulated signal with a bandwidth of 1 MHz. The minimum duration of each voltage level is set at 400 ns, as is the duration of the sliding time window. Furthermore, the DC-DC converter 5 has four possible discrete output voltage values, namely V1=20 V, V2=25 V, V3=30 V and V4=40 V.

Each voltage level has a minimum duration of 400 ns. Beyond this minimum duration, the duration of a command voltage level is only a multiple of the sampling period of the envelope tracking command signal with four discrete levels provided by the envelope tracking command logic 7.

The command signal applied to the RF power amplifier 2 is consistently greater than or equal to the envelope tracking continuous command signal in order to see to the proper operation of the RF power amplifier 2.

Thus, this type of driving of RF power amplifier 2 makes it possible to greatly decrease the stresses on the DC-DC converter 5 in terms of switching speed and thus to obtain a very good efficiency of the DC-DC converter 5 for wide modulation bands.

Figure 7:
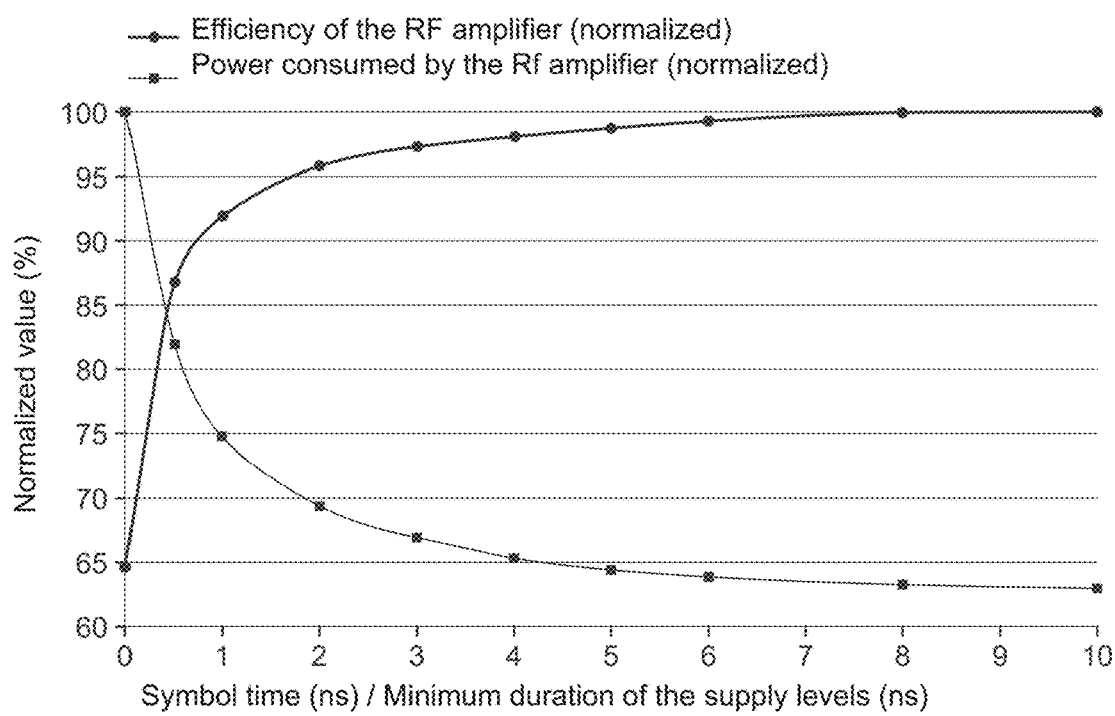
FIG. 7 illustrates exemplary curves of the efficiency and the consumed power of an RF power amplifier of the system for tracking the peak power for an RF power amplification according to the present invention as a function of the ratio of the symbol duration to be transmitted over the minimum duration of the supply levels.

FIG. 7 shows exemplary curves of the efficiency and the consumed power of an RF power amplifier 2 of the system 1 for tracking the peak power for an RF power amplification according to the present invention as a function of the ratio of the symbol duration to be transmitted over the minimum duration of the supply levels.

In this example, a modulation of type 16QAM is applied to the RF power amplifier 2. The measured efficiency for a continuous supply voltage is compared to the efficiencies obtained for different minimum supply level durations, i.e., for different sliding time window durations. The minimum duration of a supply level varies from a duration of twice the duration of a symbol to be transmitted to a duration of one tenth the duration of a symbol to be transmitted.

When the minimum duration imposed on each supply level is very short and equal to the digital sampling period, the command signal is then likened to a standard discrete envelope tracking signal with no effect of the invention.

In this example, four discrete supply levels are used to command the RF power amplifier 2. The x-axis at zero corresponds to the characteristics (efficiency of approximately 65% of the maximum efficiency and consumed power of 100%) of the RF power amplifier 2 for a fixed supply voltage, i.e., a minimum duration of supply levels which is infinite.

A minimum duration for each supply level of half of the symbol time of the signal to be transmitted makes it possible, with four supply levels, to obtain an RF power amplifier 2 efficiency close to the maximum efficiency able to be achieved with the discrete envelope tracking technique (efficiency of about 95% of the maximum efficiency and consumed power of about 70%).

The invention further makes it possible to eliminate any risk of transmission error due to excessively short pulses and to guarantee a DC-DC converter 5 efficiency greater than that of the traditional continuous envelope or multi-level tracking techniques.

The DC-DC converter 5 not needing to be as fast in terms of switching speed is therefore easier to arrange and implement. It therefore makes it possible to achieve large bandwidths while respecting the integrity of the signal to be transmitted.

The invention also relates to an RF transmission antenna equipped with the system 1 for tracking the peak power of a telecommunication signal to be transmitted for an RF power amplification according to the present invention or implementing a method for calculating the peak value and selecting the supply voltage according to the present invention.

The present invention may for example be applicable in base stations for mobile telephony, in radars, in electronic warfare devices, in mobile telephones or in any other wireless telecommunication equipment.

The invention claimed is:

1. A system for tracking the peak power of a telecommunication signal to be transmitted for an RF power amplification of the telecommunication signal to be transmitted, the system comprising:
    an RF power amplifier having
        an RF input,
        a supply voltage input, and
        an RF output;
    a digital processing device;
    a digital to RF converter; and
    a DC-DC converter,
        an input configured to receive the telecommunication signal to be transmitted in the form of digital data;
        a first output connected to an input of the digital to RF converter; and
        a second output connected to an input of the DC-DC converter,
    the digital to RF converter having an output connected to the RF input of the RF power amplifier,
    the DC-DC converter having an output connected to the supply voltage input of the RF power amplifier, the output of the DC-DC converter assuming a discrete voltage value from among N discrete voltage values, N being an integer greater than or equal to 2, a delay element τ being provided between the input and the first output of the digital processing device, a processing chain being provided between the input and the second output of the digital processing device, the processing chain comprising an envelope tracking command logic for creating an envelope tracking command signal with N discrete levels from digital data received at the input of the digital processing device, the envelope tracking command signal with N discrete levels being sampled at a predetermined sampling frequency,
        wherein the processing chain further comprises, downstream from the envelope tracking command logic, a driver logic of the DC-DC converter comprising a device for calculating the peak value and a device for selecting the supply voltage, the device for calculating the peak value being configured to:
        window the envelope tracking command signal with N discrete levels, using a sliding time window, the duration of the sliding time window being defined by a predefined number of samples of the envelope tracking command signal with N discrete levels, the offset between time windows being equal to a sample of the envelope tracking command signal with N discrete levels, and
        calculate the maximum value of the envelope tracking command signal with N discrete levels over each time window of the sliding time window,
    being configured to command the DC-DC converter in order to impose, on the output of the DC-DC converter, from among the N discrete voltage values, as a function of the maximum value of the envelope tracking command signal with N discrete levels over the current time window, of the value of the envelope tracking command signal with N discrete levels delayed by the duration of the sliding time window and of the current value of the output of the device for selecting the supply voltage, a discrete supply voltage value greater than or equal to the envelope tracking command signal with N discrete levels, the discrete supply voltage value being applied during a minimum duration equal to the duration of the sliding time window.

2. The system according to claim 1, wherein the delay element τ is chosen such that the RF signal corresponding to digital data of the telecommunication signal to be transmitted at the RF input of the RF power amplifier is synchronized with the supply voltage of the envelope tracking type of the RF signal for the digital data of the telecommunication signal to be transmitted at the RF input at the supply voltage input of the RF power amplifier.

3. The system according to claim 2, wherein the device for selecting the supply voltage comprises a time counter configured to be reset and triggered upon each change of output state of the device for selecting the supply voltage, the device for selecting the supply voltage being configured not to change the state of the output of the device for selecting the supply voltage as long as the time counter has not reached the duration of the sliding time window.

4. The system according to claim 2, wherein the envelope tracking command logic comprises a device for calculating the modulus of the telecommunication signal to be transmitted and a device for creating the envelope tracking command signal configured to create the envelope tracking command signal with N discrete levels by comparing the value of the modulus calculated by the device for calculating with predefined switching thresholds.

5. The system according to claim 2, wherein the number of voltage levels N is between 2 and 16.

6. The system according to claim 1, wherein the device for selecting the supply voltage comprises a time counter configured to be reset and triggered upon each change of output state of the device for selecting the supply voltage, the device for selecting the supply voltage being configured not to change the state of the output of the device for selecting the supply voltage as long as the time counter has not reached the duration of the sliding time window.

7. The system according to claim 6, wherein the envelope tracking command logic comprises a device for calculating the modulus of the telecommunication signal to be transmitted and a device for creating the envelope tracking command signal configured to create the envelope tracking command signal with N discrete levels by comparing the value of the modulus calculated by the device for calculating with predefined switching thresholds.

8. The system according to claim 6, wherein the number of voltage levels N is between 2 and 16.

9. The system according to claim 6, wherein the device for selecting the supply voltage further comprises an output state change decision module configured to modify the output state of the device for selecting the supply voltage, to the maximum value of the envelope tracking command signal with N discrete levels over the current time window, when the time counter has reached the duration of the sliding time window, and one event among:

the maximum value of the envelope tracking command signal with N discrete levels over the current time window is less than the current value of the output of the device for selecting the supply voltage, and the current value of the output of the device for selecting the supply voltage is less than the value of the envelope tracking command signal with N discrete levels delayed by the duration of the sliding time window.

10. The system according to claim 9, wherein the envelope tracking command logic comprises a device for calculating the modulus of the telecommunication signal to be transmitted and a device for creating the envelope tracking command signal configured to create the envelope tracking command signal with N discrete levels by comparing the value of the modulus calculated by the device for calculating with predefined switching thresholds.

11. The system according to claim 1, wherein the envelope tracking command logic comprises a device for calculating the modulus of the telecommunication signal to be transmitted and a device for creating the envelope tracking command signal configured to create the envelope tracking command signal with N discrete levels by comparing the value of the modulus calculated by the device for calculating with predefined switching thresholds.

12. The system according to claim 1, wherein the number of voltage levels N is between 2 and 16.

13. The system according to claim 1, wherein the predefined number of samples of the envelope tracking command signal with N discrete levels defining the duration of the sliding time window is between 2 and 128.

14. The system according to claim 1, wherein the digital processing device is implemented in a programmable digital circuit.

15. The system according to claim 1, wherein the DC-DC converter is of the parallel multi supply input type and cascading multi supply input type.

16. The system according to claim 1, wherein the digital to RF converter comprises a digital to analog converter associated with an RF mixer.

17. The system according to claim 1, further comprising a low-pass filter arranged between the output of the DC-DC converter and the supply voltage input of the RF power amplifier.

18. The system according to claim 1, wherein the digital processing device further comprises a predistortion logic that linearizes the gain of the RF power amplifier.

19. A method for calculating the peak value and selecting the supply voltage implemented by the system for tracking the peak power of the telecommunication signal to be transmitted for the RF power amplification according to claim 1, the method comprising the following steps:

time windowing, using a sliding time window, of an envelope tracking command signal with N discrete levels;

calculating the maximum value of the envelope tracking command signal with N discrete levels over each time window of the sliding time window;

selecting, from among N discrete voltage values, based on the maximum value of the envelope tracking command signal with N discrete levels over the current time window and on the value of the envelope tracking command signal with N discrete levels delayed of the duration of the sliding time window, the discrete supply voltage value greater than or equal to the envelope tracking command signal with N discrete levels, the discrete supply voltage value being applied during a minimum duration equal to the duration of the sliding time window; and commanding a DC-DC converter in order to impose, on the output of the latter, the selected discrete supply voltage value.

20. An RF transmission antenna equipped with the system for tracking the peak power of the telecommunications signal to be transmitted for the RF power amplification of the telecommunication signal to be transmitted according to claim 1.

\* \* \* \* \*